(12) United States Patent
Lee et al.

(10) Patent No.: US 9,093,811 B2
(45) Date of Patent: Jul. 28, 2015

(54) MULTI CHANNEL TRANSMITTER OPTICAL SUB-ASSEMBLY

(71) Applicant: Electronics and Telecommunications Research Institute, Daejeon-si (KR)

(72) Inventors: Eun-Gu Lee, Daejeon-si (KR); Eui-Suk Jung, Daejeon-si (KR); Sil-Gu Mun, Daejeon-si (KR); Han-Hyub Lee, Daejeon-si (KR); Jyung-Chan Lee, Daejeon-si (KR); Sang-Soo Lee, Daejeon-si (KR); Jong-Hyun Lee, Daejeon-si (KR)

(73) Assignee: ELECTRONICS AND TELECOMMUNICATIONS RESEARCH INSTITUTE, Daejeon-Si (KR)

( * ) Notice: Subject to any disclaimer, the term of this patent is extended or adjusted under 35 U.S.C. 154(b) by 0 days.

(21) Appl. No.: 14/094,113

(22) Filed: Dec. 2, 2013

(65) Prior Publication Data
US 2014/0153933 A1    Jun. 5, 2014

(30) Foreign Application Priority Data

Dec. 3, 2012 (KR) .......................... 10-2012-0139063
Oct. 24, 2013 (KR) .......................... 10-2013-0127258

(51) Int. Cl.
| | | |
|---|---|---|
| *H01S 5/42* | (2006.01) |
| *H01S 5/022* | (2006.01) |
| *H01S 5/02* | (2006.01) |
| *H01S 5/40* | (2006.01) |
| *H01S 5/024* | (2006.01) |
| *H01S 5/068* | (2006.01) |
| *H01S 5/026* | (2006.01) |
| *H01S 5/042* | (2006.01) |

(52) U.S. Cl.
CPC ........... *H01S 5/02272* (2013.01); *H01S 5/0212* (2013.01); *H01S 5/02212* (2013.01); *H01S 5/02276* (2013.01); *H01S 5/4025* (2013.01); *H01S 5/0261* (2013.01); *H01S 5/02415* (2013.01); *H01S 5/0425* (2013.01); *H01S 5/06804* (2013.01)

(58) Field of Classification Search
CPC ............ H01S 5/02212; H01S 5/02415; H01S 5/06804; H01S 5/4025; H01S 5/02276; H01S 5/0261; H01S 5/0425
USPC ................ 372/36, 50.12, 50.121, 50.122
See application file for complete search history.

(56) References Cited

U.S. PATENT DOCUMENTS 5,343,548 A * 8/1994 Hall et al. ....................... 385/89
5,848,210 A   12/1998 Kimura
(Continued)

FOREIGN PATENT DOCUMENTS

| JP | 10-020154 A | 1/1998 |
| JP | 2001-215425 A | 8/2001 |
| KR | 10-0825728 B1 | 4/2008 |

*Primary Examiner* — Yuanda Zhang
*Assistant Examiner* — Michael Carter
(74) *Attorney, Agent, or Firm* — Rabin & Berdo, P.C.

(57) ABSTRACT

A multi-channel transmitter optical sub-assembly (TOSA) is provided. The multi-channel TOSA includes a stem including a sub-mount, a plurality of light sources mounted on the sub-mount, a common ground pad disposed at the sub-mount and connected to ground electrodes of the light sources in common, a common lead pin installed at the stem, and connected to the common ground pad, and a thermistor mounted on the sub-mount along with the light sources.

14 Claims, 7 Drawing Sheets

(56) References Cited

U.S. PATENT DOCUMENTS

| | | |
|---|---|---|
| 6,410,904 B1 | 6/2002 | Ito et al. |
| 7,663,228 B2 * | 2/2010 | Tateiwa et al. ............... 257/709 |
| 7,792,429 B2 | 9/2010 | Park et al. |
| 8,031,751 B2 * | 10/2011 | Yamasaki et al. ............... 372/34 |
| 2002/0121671 A1 * | 9/2002 | Wakisaka et al. ............. 257/467 |
| 2004/0047377 A1 * | 3/2004 | Seki ................................ 372/43 |
| 2005/0207459 A1 * | 9/2005 | Yu et al. .......................... 372/36 |
| 2009/0067466 A1 * | 3/2009 | Miyazaki ................. 372/50.121 |

* cited by examiner

MULTI CHANNEL TRANSMITTER OPTICAL SUB-ASSEMBLY

CROSS-REFERENCE TO RELATED APPLICATION

This application claims the benefit under 35 USC. §119(a) of Korean Patent Application Nos. 10-2012-0139063, filed on Dec. 3, 2012, and 10-2013-0127258, filed on Oct. 24, 2013, the entire disclosures of which are incorporated herein by references for all purposes.

BACKGROUND

1. Field

The following description relates to a multi-channel transmitter optical sub-assembly (TOSA) having a structure in which a plurality of light sources are mounted on one stem.

2. Description of the Related Art

Wavelength division multiplexing (WDM)-based fiber to the home (FTTH), namely, a WDM-passive optical network (WDM-PON), is a scheme in which communication is made between a central base station and a subscriber using a wavelength allocated to each subscriber. Such a scheme is independently used by each subscriber, provides a large-scale communication service, has an excellent security, and is differentiated from a time division multiplexing (TDM) scheme in that modulation and demodulation of a light source are performed for only one subscriber.

An essential element for establishing an optical communication system is a TOSA. Generally, in the TOSA, one light source is mounted on one package to output light, and thus, TOSAs equal to the number of channels are required for configuring a multichannel system. For this reason, the system cost is high, and a consumption space is large. Such limitations occur in a TOSA using a distributed feedback laser diode (DFB-LD) or a Fabry-Perot laser diode (FP-LD).

To overcome such limitations, there is an example in which a hybrid optical transceiver module disclosed in Korean Patent Registration No. 10-0825728 was proposed. According to the example, the hybrid optical transceiver module is configured with a first package having a TOSA structure and a second package having a planar lightwave circuit (PLC) platform structure.

The first package includes a laser diode that outputs a transmission optical signal. The second package includes: a photodiode that receives a reception optical signal input through an optical fiber; an optical waveguide that transfers the transmission optical signal, emitted from the first package, to the optical fiber; and a wavelength division multiplex coupler that transfers the reception optical signal to the photodiode, and divides a transmission high-output optical signal and the reception optical signal.

The optical transceiver module can provide a multichannel light source in one package, but have a great volume because the use of the PLC is needed. Also, the optical transceiver module is required to multiplex one optical waveguide using the wavelength division multiplex coupler, causing a great loss.

To package multiple light sources into one TOSA, the number of pins for injecting a current and controlling a temperature should be sufficient. For example, eight pins (two anode pins and two cathode pins for each channel, namely, a total of eight pins) for injecting a current, two temperature control pins using a thermo-electric cooler (TEC), and two temperature monitoring pins, namely, a total of twelve pins, are needed for packaging a four-channel light source into one TOSA.

In this case, since the number of pins is large, a butterfly-type package is generally used for packaging pins into one TOSA. For this reason, a volume of the package is great. Also, when a laser diode that vertically outputs light to the package is used, it is difficult to package. For another example, in a quad small form-factor pluggable (QSFP) optical module, since signal lines are separately allocated, it is unable to package in a transistor outline-stem (TO-stem) structure.

A TO-can type package may be used for reducing a volume of a multi-channel light source, but in this case, the number of pins is insufficient. To overcome such a limitation, a pin which is used in common may be designated, but when the pin which is used in common corresponds to a signal line, crosstalk can occur.

SUMMARY

The following description relates to a multi-channel transmitter optical sub-assembly (TOSA) in which crosstalk can be reduced when a volume of a package is reduced, and a plurality of light sources and a plurality of lead pins can be integrated into one stem with a reduced volume despite the plurality of light sources being mounted on one stem.

In one general aspect, a multi-channel includes: a stem including a sub-mount; a plurality of light sources mounted on the sub-mount; a common ground pad disposed at the sub-mount, and connected to ground electrodes of the light sources in common; a common lead pin installed at the stem, and connected to the common ground pad; and a thermistor mounted on the sub-mount along with the light sources.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, embodiments of the present invention will be described in detail with reference to the accompanying drawings.

Figure 1:
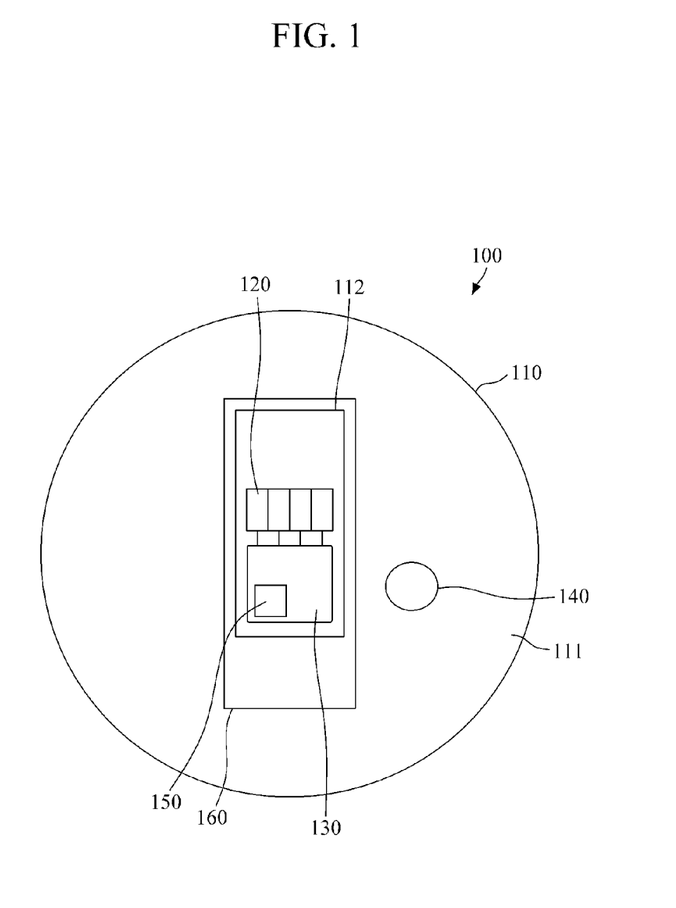
FIG. 1 is a view illustrating a configuration of a multi-channel TOSA according to an embodiment of the present invention.

FIG. 1 is a view illustrating a configuration of a multi-channel TOSA according to an embodiment of the present invention.

Referring to FIG. 1, a multi-channel TOSA 100 includes a stem 110, a plurality of light sources 120, a common ground pad 130, a common lead pin 140, and a thermistor 150.

The stem 110 functions as a base member in the multi-channel TOSA 100. The stem 110 may be configured with a TO-stem. The stem 110 may be formed of metal to have a cylindrical shape. The stem 110 may include a sub-mount 112. The sub-mount 112 may be mounted on a mounting surface 111 corresponding to a circular surface of one side of the stem 110.

The light sources 120 are mounted on the sub-mount 112. The light sources 120 may be mounted on the sub-mount 112 by technology such as flip chip bonding or die bonding. The light sources 120 may be arranged in one row, and output optical signals of different wavelengths. Therefore, the multi-channel TOSA 100 may have channels equal to the number of light sources 120. The light sources 120 may be configured with a semiconductor laser. Each of the light sources 120 may include an anode electrode and a cathode electrode. When the anode electrode controls an amount of current injected into a corresponding light source 120, the cathode electrode may be used as a ground electrode. Alternatively, when the cathode electrode controls an amount of current injected into the corresponding light source 120, the anode electrode may be used as the ground electrode.

The common ground pad 130 is disposed at the sub-mount 112. The common ground pad 130 may be disposed adjacent to ground electrodes of the light sources 120. The common ground pad 130 is provided as one, and connected to the ground electrodes of the light sources 120 in common.

The common lead pin 140 is installed at the stem 110. The common lead pin 140 may be inserted into a through hole which is formed at the stem 110 in a direction vertical to a mounting surface 111 of the stem 110, and may protrude to a surface opposite to the mounting surface 111 of the stem 110. A dielectric may be charged into the through hole to surround a circumference of each of the common lead pins 140. The common lead pins 140 may be formed of a conductive metal material. The common lead pin 140 is provided as one, and connected to the common ground pad 130. The common lead pin 140 may be connected to the common ground pad 130 in the wiring method using a wire or the like.

The thermistor 150 is mounted on the sub-mount 112 along with the light sources 120. The thermistor 150 senses temperatures of the light sources 120 in driving the light sources 120. Information on the temperature sensed by the thermistor 150 is supplied to an external controller, which controls a driving of a thermal electric cooler 160 on the basis of the sensed temperature information such that the temperatures of the light sources 120 do not exceed a setting value.

One electrode of the thermistor 150 may be connected in common to the common ground pad 130 along with the ground electrodes of the light sources 120. Accordingly, the number of lead pins can decrease by one unlike that two lead pins are provided to be connected to both electrodes of the thermistor 150. As a result, the stem 110 can decrease an installation space for is a thermistor lead pin. In addition, the thermistor 150 may be mounted on the sub-mount 112 to be separated from the common ground pad 130, and one electrode of the thermistor 150 may be connected to the common lead pin 140 by wiring.

Figure 3:
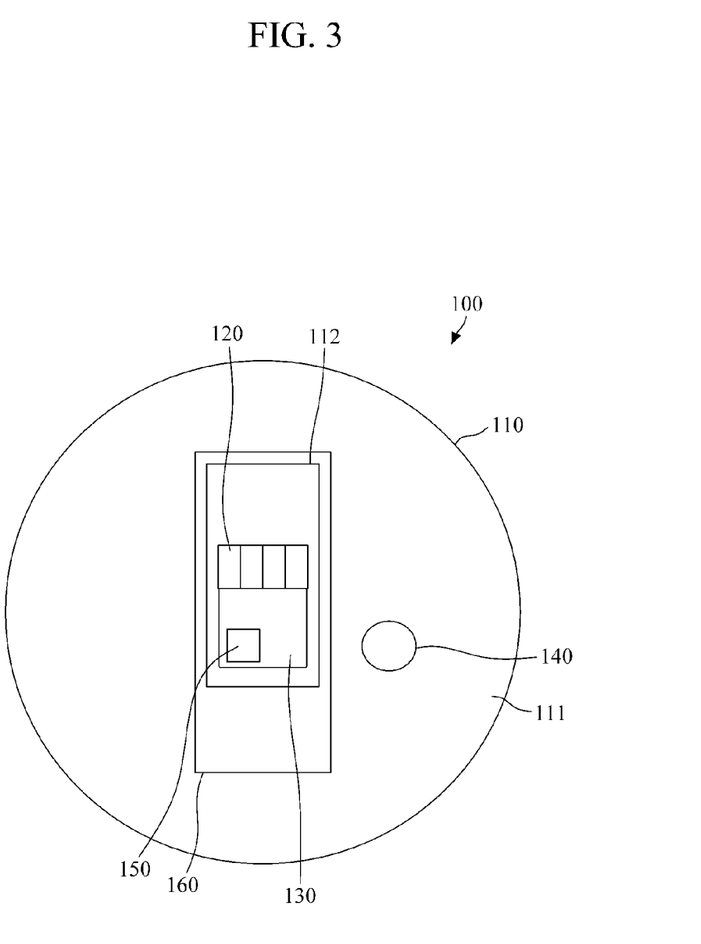
FIG. 3 is a view illustrating another example in which a common ground pad is a plurality of light sources in FIG. 1.

The ground electrodes of the light sources 120 may be connected to the common ground pad 130 by wiring and flip chip bonding. When a current is injected into the anode electrode of each of the light sources 120, a return current flows through a ground path. When the ground electrodes of the light sources 120 are connected to the common ground pad 130 by the wiring, an area of a path through which the return current flows is reduced, and thus, there is a high possibility that electrical crosstalk occurs. Therefore, in order to reduce electrical crosstalk, as illustrated in FIG. 3, the ground electrodes of the light sources 120 may be connected to the common ground pad 130 by only the flip chip bonding without using the wiring.

According to the multi-channel TOSA 100 having the above-described configuration, the light sources 120 and the thermistor 150 are mounted on one sub-mount 112. For example, when the light sources 120 and the thermistor 150 are respectively mounted on two separated first and second sub-mounts, a portion in which heat is emitted by the light sources 120 is separated from a portion in which a temperature is monitored by the thermistor 150, and thus, a great difference can occur between an actual temperature at the first sub-mount and a measurement temperature at the second sub-mount.

When an injection current increases in a semiconductor laser used as each light source 120, some of the injection current is converted into light, and the other generates heat. The generated heat does not cause a great problem in a single light source configured with one channel, but changes a temperature of an adjacent channel to change an operation characteristic in multi light sources configured with a multi-channel. That is, when an operation characteristic is changed by changing a current of one of the light sources 120, due to heat generated by the changed current, operation characteristics of the other light sources are unintentionally changed. For this reason, thermal crosstalk can occur.

However, as in the embodiment, when the light sources 120 and the thermistor 150 are mounted on one sub-mount 112 along with each other, despite a change in an operating condition such as a current of a specific light source, an influence of the changed operating condition can be considerably reduced on operation characteristics, such as operation wavelengths and light power, of the other light sources. Accordingly, thermal crosstalk in which one light source affects the other light sources can be reduced.

Figure 2:
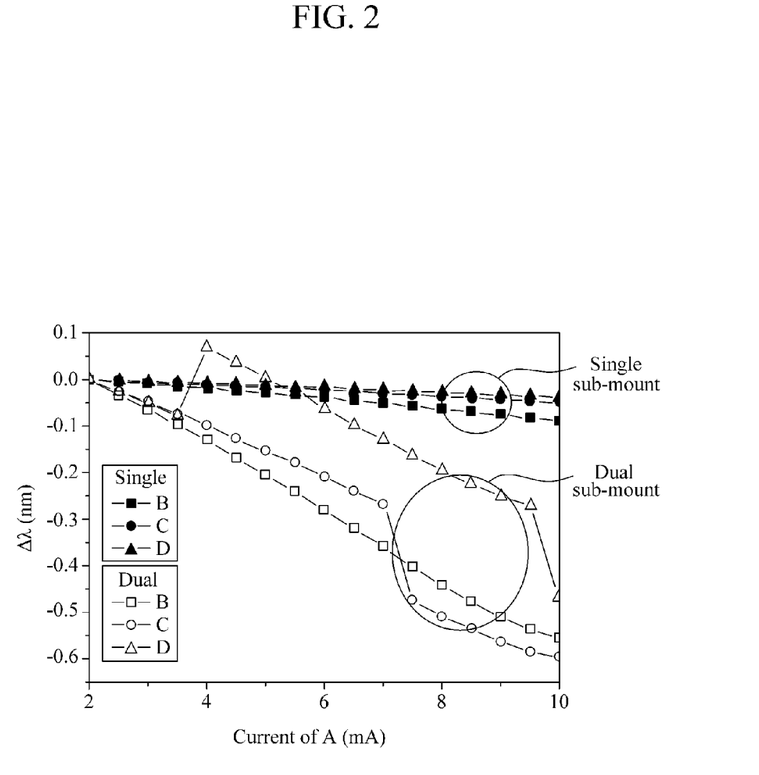
FIG. 2 is a graph that compares wavelength changes of a light source A in an example in which a light source and a thermistor are mounted on a single sub-mount and an example in which the light source and the thermistor are mounted on dual sub-mounts.

Such an effect will be described with reference to FIG. 2. FIG. 2 is a graph showing wavelength changes of a light source A due to injection current changes of light sources B, C, and D in a case in which a light source and a thermistor are mounted on a single sub-mount and a case in which the light source and the thermistor are mounted on separated dual sub-mounts. As shown in FIG. 2, it can be seen that the wavelength change of the light source A decreases by ten times in areas marked as circular blocks in the case in which the light source and the thermistor are mounted on the single sub-mount than the case in which the light source and the thermistor are mounted on the dual sub-mounts.

Moreover, according to the multi-channel TOSA 100 having the above-described configuration, the ground electrodes of the light sources 120 are connected to the common ground pad 130 in common, and the common ground pad 130 is connected to one common lead pin 140. That is, one common lead pin 140 is used in common for the ground electrodes of the light sources 120 via the common ground pad 130.

Therefore, rather than ground-electrode lead pins are provided as a number equal to the number of ground electrodes to be respectively connected to the ground electrodes of the light sources 120, the number of ground-electrode lead pins can be reduced. For example, when the number of light sources 120 is four, the number of ground-electrode lead pins can be reduced from four to one. Also, since one electrode of the thermistor 150 is connected in common to the common ground pad 130 along with the ground electrodes of the light sources 120, the number of thermistor lead pins can be reduced from two to one. Accordingly, the stem 110 can reduce an installation space for the ground-electrode lead pins and the thermistor lead pins, and thus the light sources 120 and the common lead pin 140 can be integrated into the stem 110 with a small volume.

The thermal electric cooler 160 may be mounted on the mounting surface 111 of the stem 110. The thermal electric cooler 160 may be disposed between the mounting surface 111 of the stem 110 and the sub-mount 112. The thermal electric cooler 160 cools the light sources 120.

Figure 4:
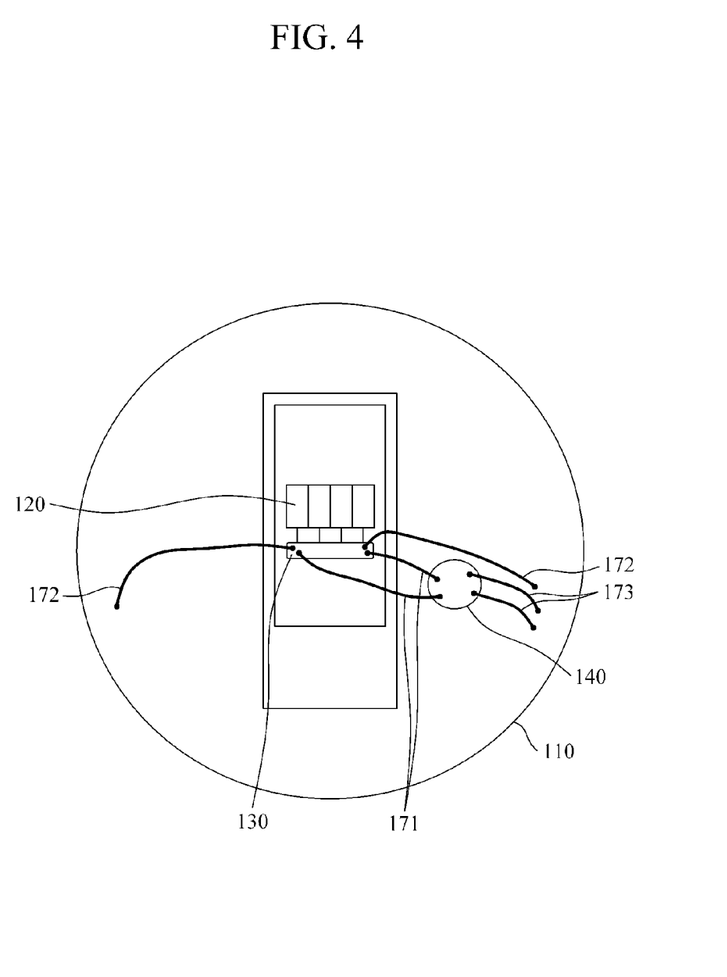
FIG. 4 is a view illustrating a wiring structure of the common ground pad in FIG. 1.

FIG. 4 is a view illustrating a wiring structure of the common ground pad 130. Referring to FIG. 4, a plurality of first wires 171 wire the common ground pad 130 to the common lead pin 140 as two or more, thus reducing crosstalk.

Specifically, a current injected into an anode electrode of each light source 120 is transferred to the common lead pin 140 through the common ground pad 130. In this case, when the common ground pad 130 and the common lead pin 140 are wired to each other by one first wire 171, a path of a return current is reduced, and thus, there is a high possibility that electrical crosstalk occurs. However, when the common ground pad 130 and the common lead pin 140 are wired to each other by two or more first wires 171, the path of the return current is expanded, and thus, crosstalk can be reduced.

Moreover, at least one or more second wires 172 may wire the common ground pad 130 to the stem 110, and at least one or more third wires 173 may wire the common lead pin 140 to the stem 110 as at least one or more. Accordingly, the path of the return current is additionally secured, thus further decreasing crosstalk.

Figure 5:
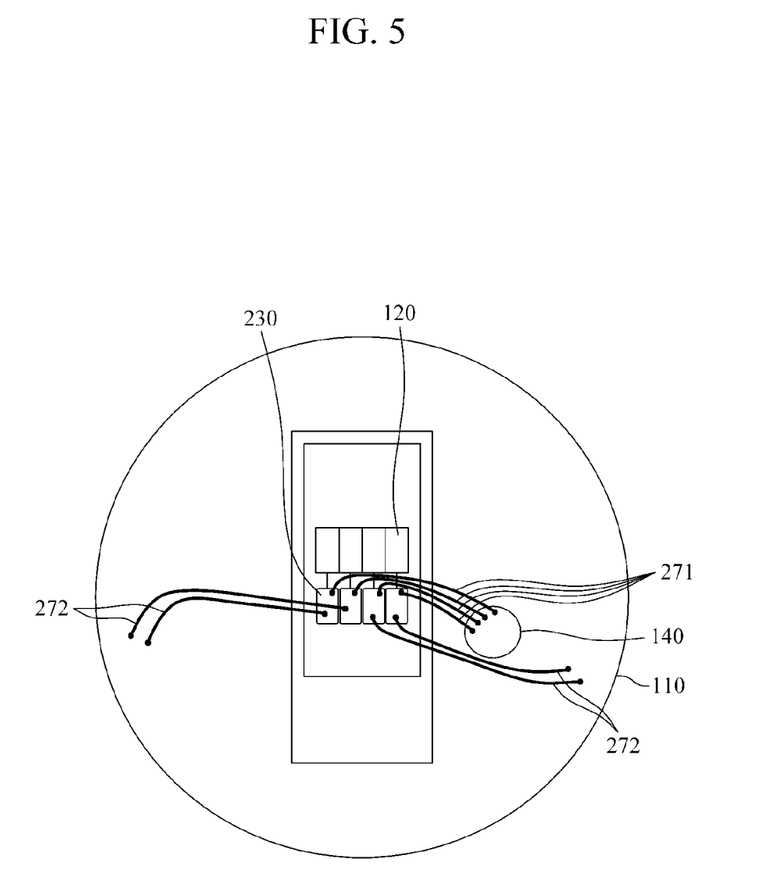
FIG. 5 is a view illustrating a wiring structure of a common ground pad according to another example in FIG. 4.

As illustrated in FIG. 5, a common ground pad 230 may have a type in which portions connected to the ground electrodes of the light sources 120 are separated from each other. Therefore, the number of common paths of return currents used by the light sources 120 is minimized, thus reducing crosstalk. That is, the common path is provided for only the common lead pin 140.

A plurality of first wires 271 may wire the separated common ground pads 230 to the common lead pin 140. Also, a plurality of second wires 272 may wire the separated common ground pads 230 to the stem 110.

Portions of the common ground pads 230 connected to the ground electrodes of the light sources 120 may not be all divided, and the common ground pad 230 may be divided into only two or more portions. For example, when the number of ground electrodes of the light sources 120 is four, the common ground pad 230 may be divided into portions connected to two ground electrodes among the four ground electrodes and portions connected to the other two ground electrodes. Alternatively, the common ground pad 230 may be divided into portions connected to three ground electrodes among the four ground electrodes and a portion connected to the other one common ground.

Figure 6:
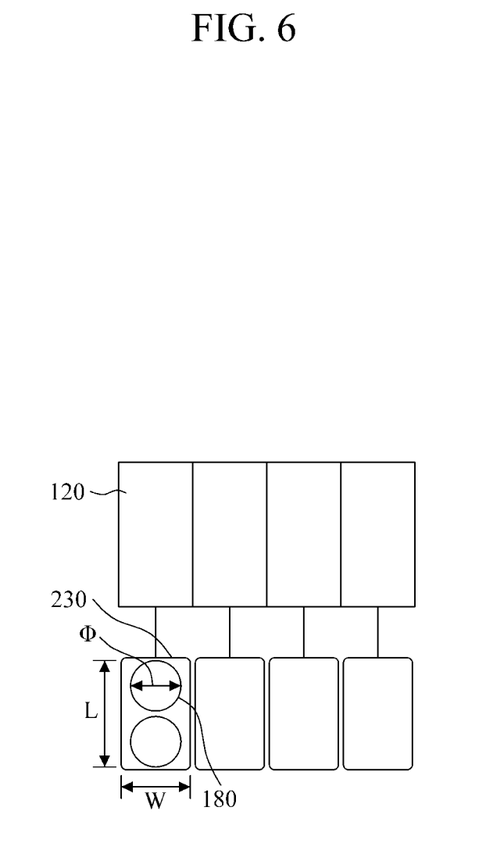
FIG. 6 is a view for describing an area setting of the common ground pad in FIG. 5.

As illustrated in FIG. 6, an area of the common ground pad 230 should be sufficiently large for wiring two or more wires to one common ground pad 230. When a solder ball 180 is used for wiring, the area of the common ground pad 230 should be two or more times bigger is than a cross-sectional area of the solder ball 180. For example, when the common ground pad 230 is tetragonal in shape, a length W of one side of the common ground pad 230 should be bigger than a diameter $\Phi$ of the solder ball 180, and a length L of the other side of the common ground pad 230 should be two or more times bigger than the diameter $\Phi$ of the solder ball 180.

Figure 7:
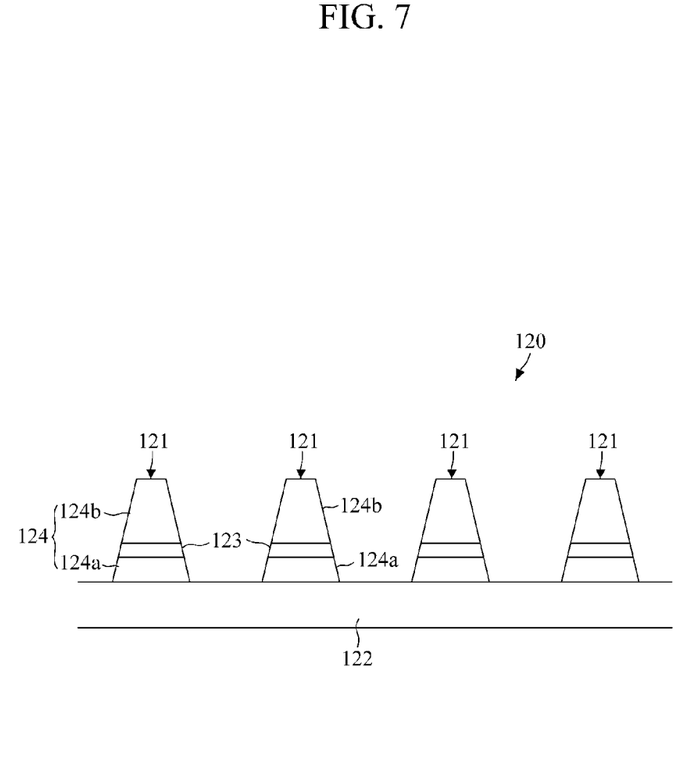
FIG. 7 is a cross-sectional view schematically illustrating a structure of light sources in FIG. 5.

FIG. 7 is a cross-sectional view schematically illustrating a structure of light sources 120. Referring to FIG. 7, the light sources 120 may be configured as a semiconductor laser diode array. The semiconductor laser diode array may be configured with a plurality of laser emitting parts 121 which are arranged in one row. The laser emitting parts 121 act as the respective light sources 120. Each of the laser emitting parts 121 is provided in a structure in which an active layer 123 and a conductive layer 124 are stacked on a substrate 122. The conductive layer 124 may include an N-layer 124a and a P-layer 124b. The N-layer 124a may be disposed closer to the substrate 122 than the P-layer 124b with the active layer 123 therebetween.

Moreover, the laser emitting parts 121 are provided in a type in which a boundary is removed up to the substrate 122. Accordingly, the N-layer 124a and the P-layer 124b may be physically separated from each other between the laser emitting parts 121, thus decreasing crosstalk.

According to the present invention, thermal and electrical crosstalk can be reduced when a volume of a package is reduced. Also, according to the present invention, a plurality of light sources and a plurality of lead pins can be integrated into one stem with a reduced volume despite the plurality of light sources being mounted on one stem.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multi-channel transmitter optical sub-assembly (TOSA) comprising:
   a stem including a sub-mount;
   a plurality of light sources mounted on the sub-mount;
   a common ground pad disposed at the sub-mount, and connected to each of a plurality of ground electrodes of the light sources, the common ground pad having portions being respectively connected to the ground electrodes of the light sources and separated from each other;
   a common lead pin installed at the stem, and connected to the common ground pad; and
   a thermistor mounted on the sub-mount along with the light sources,
   wherein each of the portions is electrically connected to the common lead pin, the common lead pin being the only pin electrically connected to the portions.

2. The multi-channel TOSA of claim 1, wherein one electrode of the thermistor is connected to the common ground pad.

3. The multi-channel TOSA of claim 1, further comprising a plurality of first wires each configured to wire the common ground pad to the common lead pin.

4. The multi-channel TOSA of claim 3, further comprising at least one second wire configured to wire the common ground pad to the stem.

5. The multi-channel TOSA of claim 4, further comprising at least one third wire configured to wire the common lead pin to the stem.

6. The multi-channel TOSA of claim 1, wherein each of the portions of the common ground pad is separated from all others of the portions.

7. The multi-channel TOSA of claim 1, further comprising a plurality of first wires configured to wire the portions of the common ground pad to the common lead pin.

8. The multi-channel TOSA of claim 7, further comprising a plurality of second wires configured to wire the portions of the common ground pad to the stem.

9. The multi-channel TOSA of claim 1, wherein the light sources are configured as a semiconductor laser diode array,
the semiconductor laser diode array includes a plurality of laser emitting parts each having an active layer and a conductive layer stacked on a substrate, the laser emitting parts being arranged in one row, and
the laser emitting parts are provided in a type in which a boundary of each of the laser emitting parts is at the substrate.

10. The multi-channel TOSA of claim 1, wherein the portions are connected to the ground electrodes so that one of the portions is electrically connected with a plurality of the ground electrodes.

11. A multi-channel transmitter optical sub-assembly (TOSA) comprising:
a stem including a sub-mount;
a plurality of light sources mounted on the sub-mount;
a single common ground pad disposed at the sub-mount, and connected to each of a plurality of ground electrodes of the light sources;
a plurality of separate second wires each connecting the single common ground pad with the stem, a first of the second wires being in direct contact with a first side of the single common ground pad and a second of the second wires being in direct contact with a second side of the single common ground pad opposite the first side; and
a common lead pin installed at the stem, and connected to the common ground pad.

12. The multi-channel TOSA of claim 11, wherein the first of the second wires connects the single common ground pad with the stem by extending in a direction opposite from that of the second of the second wires.

13. The multi-channel TOSA of claim 11, further comprising a plurality of first wires each configured to wire the single common ground pad to the common lead pin.

14. The multi-channel TOSA of claim 13, further comprising at least one third wire configured to wire the common lead pin to the stem.

* * * * *